United States Patent
Kozak et al.

(10) Patent No.: US 7,605,653 B2
(45) Date of Patent: Oct. 20, 2009

(54) SIGMA-DELTA BASED CLASS D AUDIO POWER AMPLIFIER WITH HIGH POWER EFFICIENCY

(75) Inventors: Mucahit Kozak, Victor, NY (US); Eugene Petilli, Victor, NY (US)

(73) Assignee: Intrinsix Corporation, Marlborough, MA (US)

(*) Notice: Subject to any disclaimer, the term of this patent is extended or adjusted under 35 U.S.C. 154(b) by 0 days.

(21) Appl. No.: 11/839,598

(22) Filed: Aug. 16, 2007

(65) Prior Publication Data

US 2008/0042745 A1 Feb. 21, 2008

Related U.S. Application Data

(60) Provisional application No. 60/822,567, filed on Aug. 16, 2006.

(51) Int. Cl.
*H03F 3/217* (2006.01)
(52) U.S. Cl. ......................... 330/251; 330/10
(58) Field of Classification Search .................. 330/10, 330/207 A, 251; 375/238
See application file for complete search history.

(56) References Cited

U.S. PATENT DOCUMENTS

| | | | |
|---|---|---|---|
| 5,528,239 A | 6/1996 | Swanson et al. | |
| 5,815,102 A | 9/1998 | Melanson | |
| 6,061,010 A | 5/2000 | Adams | |
| 6,222,478 B1 | 4/2001 | Bright | |
| 6,373,334 B1 | 4/2002 | Melanson | |
| 6,462,687 B1 | 10/2002 | Esraghi et al. | |
| 6,466,087 B2* | 10/2002 | Ruha | 330/251 |
| 6,476,748 B1 | 11/2002 | Galton | |
| 6,552,606 B1* | 4/2003 | Veltman et al. | 330/251 |
| 6,646,502 B1 | 11/2003 | Kruiskamp | |

(Continued)

OTHER PUBLICATIONS

Varona et al, "A Low-Voltage Fully-Monolithic ΔΣ-Based Class-D Audio Amplifier", Solid-State Circuits Conference, 2003, ESSIRC '03 Proceedings of the 29th European, dated Sep. 16-18, 2003, pp. 545-548.

(Continued)

*Primary Examiner*—Khanh V Nguyen
(74) *Attorney, Agent, or Firm*—Daly, Crowley, Mofford & Durkee, LLP

(57) ABSTRACT

An amplifier capable of driving an analog load is provided. The amplifier comprises a sigma delta modulator (SDM), a pulse processing circuit, an output stage, and a feedback loop. The SDM produces a plurality of noise-shaped output pulses based upon a digital input signal to the amplifier and an error signal. The pulse processing circuit processes at least a portion of the plurality of noise-shaped output pulses to ensure that each of the noise-shaped output pulses in the portion contains an amount of energy that is as close as possible to the amount of energy in the other pulses. The output stage is coupled to the pulse processing circuit and has first state wherein the output stage provides analog noise-shaped output energy pulses to a load and a second state where the output energy delivered is essentially zero. The feedback loop is coupled between the output stage and the SDM. The feedback loop samples the energy provided to the load during the first state by measuring the load during the second state and generates an error signal based on the difference between the sampled portion of the noise-shaped output pulses and the input digital signal to the amplifier.

38 Claims, 4 Drawing Sheets

U.S. PATENT DOCUMENTS

| | | |
|---|---|---|
| 6,724,249 B1 | 4/2004 | Nilsson |
| 6,759,899 B2 | 7/2004 | Lennartson et al. |
| 6,771,121 B2 | 8/2004 | Nilsson et al. |
| 6,794,930 B1 | 9/2004 | Nurminen |
| 6,822,593 B2 | 11/2004 | Level et al. |
| 6,924,757 B2 | 8/2005 | Adams et al. |
| 6,943,620 B2 | 9/2005 | Anderson et al. |
| 6,943,717 B1 | 9/2005 | Forejt |
| 6,952,131 B2 | 10/2005 | Jeong et al. |
| 2005/0162222 A1 | 7/2005 | Hezar et al. |

OTHER PUBLICATIONS

Gaalaas, et al. "Integrated Stereo ΔΣ Class D Amplifier," IEEE Journal of Solid-State Circuits, vol. 40, No. 12, Dec. 2005, pp. 2388-2397.

Nguyen et al, "A 113dB SNR Oversampling Sigma-Delta DAC for CD/DVD Applicaton," IEEE Transactions on Consumer Electronics, vol. 44, Issue 3, Aug. 1998, pp. 1019-1023.

Breasch et al, "TMS320C67-Based Design of a Digital Audio Power Amplifier Introducing Novel Feedback Strategy", Proceedings of the IEEE International Symposium on Industrial Electronics, 2005, vol. 2, Issue 20-23 Jun. 2005, pp. 525-528, vol. 2.

Brotton, Dave, Sound Advice for Class D Amplifiers, from www.edn.com, Apr. 28, 2005, pp. 65-70.

PAIR file for U.S. Appl. No. 11/839,600, filed Aug. 16, 2007, through Jun. 29, 2009, 81 pages.

* cited by examiner (A)

(B)

SIGMA-DELTA BASED CLASS D AUDIO POWER AMPLIFIER WITH HIGH POWER EFFICIENCY

CROSS REFERENCE TO RELATED APPLICATIONS

This application claims priority to U.S. Provisional Patent Application No. 60/822,567 filed on Aug. 16, 2006, which is incorporated herein by reference.

STATEMENT REGARDING FEDERALLY SPONSORED RESEARCH

Not applicable

FIELD OF THE INVENTION

Embodiments of the invention generally relate to devices, systems, and methods for providing amplifiers. More particularly, the invention relates to devices, systems and methods that use sigma delta modulators and feedback signals to help increase effective power efficiency of circuits such as Class D amplifiers.

BACKGROUND OF THE INVENTION

Conventional linear power amplifiers (e.g. class A and AB) essentially develop a varying voltage drop across the output driver transistors to reproduce a linear input waveform, which results in power losses at the driver transistors. To achieve improved efficiency, many power amplifiers employ switching power output stages (e.g. class D). For reasons such as this, Class-D power amplifiers have become very favorable in these applications. In audio and servo control applications, a switching power amplifier may have to accept digital input signals, because the incoming signals may be in the digital format (such as in a CD player or in a digital control of a motor).

A Class-D Amplifier uses a technique such as pulse width modulation (PWM) or pulse density modulation (PDM) to convert the incoming input signal, via a sigma delta modulator (SDM) into one or more high frequency pulses having equal width. For example, known class-D switching amplifiers can use a digital Pulse Width Modulator (PWM) to convert an incoming Pulse Code Modulation (PCM) digital signal into PWM signals that can be directly connected to a switching power amplifier. The PWM signals of a Class-D amplifier can drive a switching output stage, such as an inverter or an H-bridge driver (which has three switching levels, i.e., 0, −V, and +V) to drive an external load, such as an external speaker or a servo motor. Optionally, the signal to the load can first be filtered, such as by a low pass filter.

In this case, at any given time the transistors in the output stage are either turned fully on or off, which results in minimal power loss through the transistors of the driver. The voltage delivered to the load is typically controlled by applying pulse-width modulated (PWM) switching waveform to the driver transistor inputs, i.e. a fixed-frequency waveform with a varying duty cycle. The power driver output waveform is smoothed by the low pass filter effect of the load device and/or a power filter network. A drawback to this conventional PWM technique is the presence of a relatively large noise component at the fixed PWM switching frequency.

More recently, instead using a PWM converter, the use of a digital SDM has been proposed in the design of Class-D power amplifiers. For example, in applications such as audio applications, sigma delta modulation can drive an output driver or switching circuit such as an h-bridge. The sigma delta modulation also provides a noise shaping function. These controllers present a pulse-density modulated control signal to the output driver, wherein the number of switching pulses per unit time increases with the magnitude of the input. In this case switching noise is distributed over a broader range of frequencies than in the fixed-frequency PWM technique, resulting in lower peak noise. In addition, because use of SDM causes noise power to be spread over a bandwidth related to the sampling frequency of the SDM, the noise-shaped SDM pulses result in less distortion and noise in the band of interest, as compared with the conventional PWM-based systems. However, both of these conventional systems suffer from load modulation and low power efficiency problems. For example, if an SDM modulator is used in a Class-D power amplifier, there can be switching losses at the power amplifier stage that can reduce efficiency.

SUMMARY OF THE INVENTION

The following presents a simplified summary in order to provide a basic understanding of one or more aspects of the invention. This summary is not an extensive overview of the invention, and is neither intended to identify key or critical elements of the invention, nor to delineate the scope thereof. Rather, the primary purpose of the summary is to present some concepts of the invention in a simplified form as a prelude to the more detailed description that is presented later.

At least some embodiments of the invention help address Class-D power amplifier problems such as those problems relating to load modulation and lower power efficiency. In one embodiment, as described herein, by sensing the load signal and feeding it back to the input of the digital SDM via using a feedback analog to digital converter (ADC), power efficiency is increased significantly.

In one embodiment, an amplifier capable of driving an analog load is provided. The amplifier can be constructed and arranged to operate as at least one circuit selected from the group consisting of a class D amplifier, voltage regulator, audio amplifier, servo amplifier, servo control, digital control, switching power supply, and switching power amplifier.

The amplifier comprises a sigma delta modulator (SDM), a pulse processing circuit, an output stage, and a feedback loop. The SDM produces a plurality of noise-shaped output pulses based upon a digital input signal to the amplifier and an error signal. The pulse processing circuit processes at least a portion of the plurality of noise-shaped output pulses to ensure that each of the noise-shaped output pulses in the portion contains an amount of energy that is as close as possible to the amount of energy in the other pulses. The output stage is coupled to the pulse processing circuit and has first state wherein the output stage provides analog noise-shaped output energy pulses to a load and a second state where the output energy delivered is essentially zero. The feedback loop is coupled between the output stage and the SDM. The feedback loop samples the energy provided to the load during the first state by measuring the load during the second state and generates an error signal based on the difference between the sampled portion of the noise-shaped output pulses and the input digital signal to the amplifier. The feedback loop can convert the noise-shaped output pulses to digital pulses and provided the error signal as a digital signal. The feedback loop can further comprise an analog-to-digital (A/D) converter (such as a three-level A/D converter or flash A/D converter), the A/D converter converting a plurality of analog noise-shaped output pulses from the output stage to a corresponding plurality of digital pulses.

The output stage can comprise at least one element selected from the group consisting of an H-bridge, an output driver, a switching output stage, boost output stage, buck-boost output stage, a Class-D switching stage, and a tri-state buffer. The pulse processing circuit can further comprise a circuit capable of equalizing switching transitions that occur in the SDM, such as a half return to zero circuit (HRZ) or a return to zero (RTZ) circuit and can ensure that ensures that each noise-shaped output pulse contains the same number of rising and falling edges.

The SDM and the pulse processing circuit can be coupled to a clock signal, and the output stage can be configured to be in the second state during a return-to-zero portion of the clock signal. The feedback loop can sample the portion of the noise shaped output pulses during a portion of the clock signal when the output stage is disconnected from the load.

In another aspect, the invention provides a method of driving an analog load with a digital signal. A digital input signal is received and converted to a plurality of noise shaped pulses. At least a portion of the plurality of noise-shaped output pulses is processed to ensure that each of the noise shaped output pulses in the portion contains an amount of energy that is as close as possible to the amount of energy in the other pulses. A sample of energy delivered by the output pulses is obtained. An error signal is generated based on the difference between the sampled processed noise-shaped output pulses, and the error signal is used during the conversion of the digital input signal to a plurality of noise-shaped pulses.

It can be ensured that each noise-shaped output pulse contains the same number of rising and falling edges. The processed noise-shaped output pulses can be switchably provided to a load, wherein during at least a first portion of time the processed noise-shaped output pulses are provided to a load and during at least a second portion of time the load receives essentially zero output energy (optionally, a sample can be obtained during the second portion of time).

The conversion of the digital input signal and the processing of the noise-shaped pulses can be synchronized with a clock signal and wherein the sample is obtained during a return-to-zero (RTZ) portion of the clock signal. The processed portion of the plurality of noise-shaped output pulses can be provided to a load.

In yet another aspect, the invention provides a system for driving for driving an analog load with a digital signal, the system comprising means for receiving a digital input signal; means for converting the digital input signal to a plurality of noise shaped pulses; means for processing at least a portion of the plurality of noise-shaped output pulses to ensure that each of the noise shaped output pulses in the portion contains an amount of energy that is as close as possible to the amount of energy in the other pulses; means for obtaining a sample of at least a portion of the processed noise-shaped output pulses; means for generating an error signal based on the difference between the sampled processed noise-shaped output pulses; and means for using the error signal during the conversion of the digital input signal to a plurality of noise-shaped pulses.

In one embodiment, the system further comprises means for suppressing at least a portion of noise associated with the noise shaped output pulses before the noise-shaped output pulses are provided to a load and/or means for ensuring that each noise-shaped output pulse contains the same number of rising edges as falling edges.

In a still further aspect, the invention provides an article of manufacture comprising a computer useable medium and computer readable code embodied on the computer useable medium for driving an analog load with a digital signal. The computer readable code comprises computer readable program code devices configured to receive a digital input signal; computer readable program code devices configured to convert the digital input signal to a plurality of noise shaped pulses; computer readable program code devices configured to process at least a portion of the plurality of noise-shaped output pulses to ensure that each of the noise shaped output pulses in the portion contains an amount of energy that is as close as possible to the amount of energy in the other pulses; computer readable program code devices configured to obtain a sample of at least a portion of the processed noise-shaped output pulses; computer readable program code devices configured to generate an error signal based on the difference between the sampled processed noise-shaped output pulses; and computer readable program code devices configured to use the error signal during the conversion of the digital input signal to a plurality of noise-shaped pulses.

The article of manufacture can further comprise computer readable program code devices configured to ensure that each noise-shaped output pulse contains the same number of rising edges as falling edges. The article of manufacture can further comprise computer readable program code devices configured to switchably provide the processed noise-shaped output pulses to a load, wherein during at least a first portion of time the processed noise-shaped output pulses are provided to a load and during at least a second portion of time (during which a sample can be obtained) the load receives essentially zero output energy.

The article of manufacture can further comprise computer readable program code devices configured to synchronize the conversion of the digital input signal and the processing of the noise-shaped pulses with a clock signal and computer readable program code devices configured to obtain the sample during a return-to-zero (RTZ) portion of the clock signal.

In another aspect, the invention provides a computer data signal embodied in a transmission medium, the computer data signal comprising a code segment including instructions for receiving a digital input signal; a code segment including instructions for converting the digital input signal to a plurality of noise shaped pulses; a code segment including instructions for processing at least a portion of the plurality of noise-shaped output pulses to ensure that each of the noise shaped output pulses in the portion contains an amount of energy that is as close as possible to the amount of energy in the other pulses; a code segment including instructions for obtaining a sample of at least a portion of the processed noise-shaped output pulses; a code segment including instructions for generating an error signal based on the difference between the sampled processed noise-shaped output pulses; and a code segment including instructions for using the error signal during the conversion of the digital input signal to a plurality of noise-shaped pulses.

In yet another aspect, the invention provides a signal path comprising a sigma delta modulator (SDM), a pulse processing circuit, an output stage, and a feedback loop. The SDM receives a digital input signal and producing a plurality of noise-shaped output pulses based upon the digital input and an error signal. The pulse processing circuit processes at least a portion of the plurality of noise-shaped output pulses to ensure that each of the noise-shaped output pulses in the portion contains an amount of energy that is as close as possible to the amount of energy in the other pulses. The output stage is coupled to the pulse processing circuit and has a first state wherein the output stage is capable of providing analog noise-shaped output pulses to a load and a second state where the output stage is delivers essentially zero output energy to the load. The feedback loop is coupled between the output stage and the SDM, and the feedback loop samples at least a portion of the noise-shaped output pulses provided by the output stage when the output stage is in the second state, and generates an error signal based on the difference between the sampled portion of the noise-shaped output pulses and the input digital signal to the amplifier.

Details relating to this and other embodiments of the invention are described more fully herein.

BRIEF DESCRIPTION OF THE DRAWINGS

The advantages and aspects of the present invention will be more fully understood in conjunction with the following detailed description and accompanying drawings, wherein.

In the drawings, like reference numbers indicate like elements, and like or related elements will have like or related alpha, numeric or alphanumeric designators.

DETAILED DESCRIPTION

Embodiments of the invention described herein include systems, methods, and apparatuses that relate to the design of Class-D switching power amplifiers having high power efficiency and which, in at least some embodiments, use a digital or analog sigma delta modulator (SDM) in conjunction with an additional feedback signal to increase the effective power efficiency of the system, method, and/or apparatus. Embodiments of the Class-D switching power amplifier systems, methods, and apparatuses, in accordance with the invention, have numerous applications, including, but not limited to, audio applications, digital control applications, servo application, power supply applications, voltage regulation applications, and related applications. Embodiments of the Class-D amplifier described herein further include embodiments that receive an analog or digital signal as an input and provide an analog signal to an external load.

Figure 1:
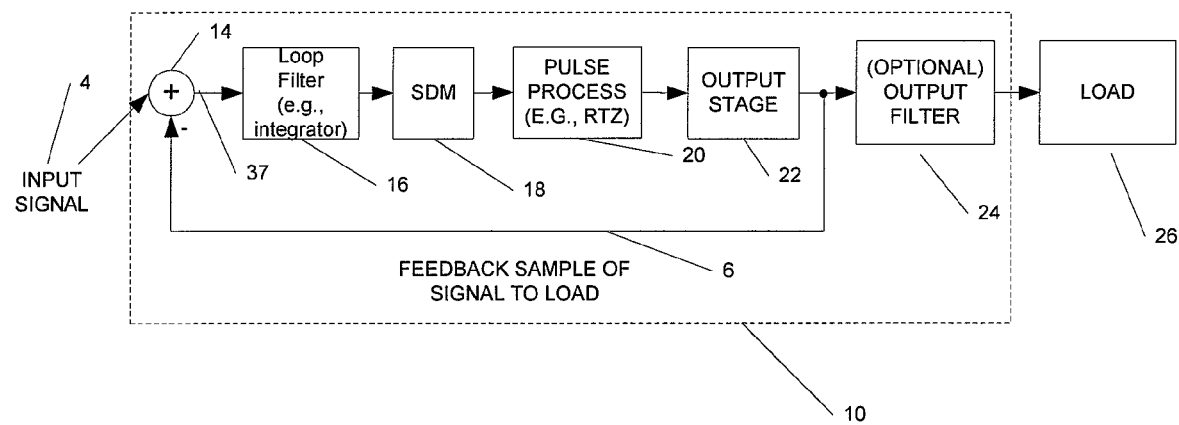
FIG. 1 is a general block diagram of an amplifier circuit in accordance with a first embodiment of the invention.
Figure 2:
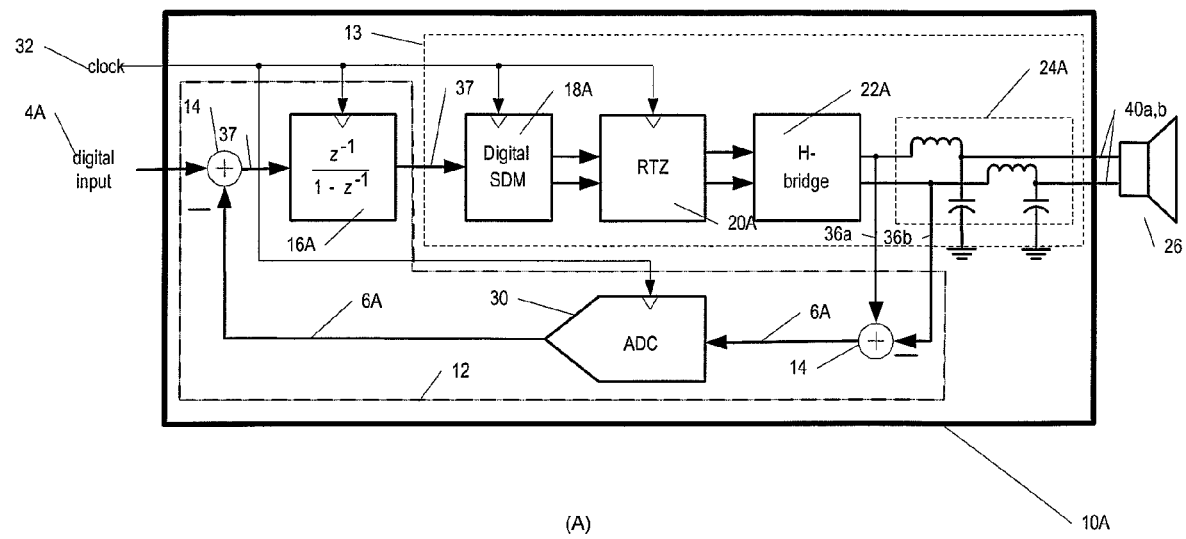
FIG. 2A is a block diagram of an amplifier circuit in accordance with a second embodiment of the invention.
FIG. 2B is a block diagram of the sigma delta modulator (SDM) of FIG. 2A.
Figure 2:
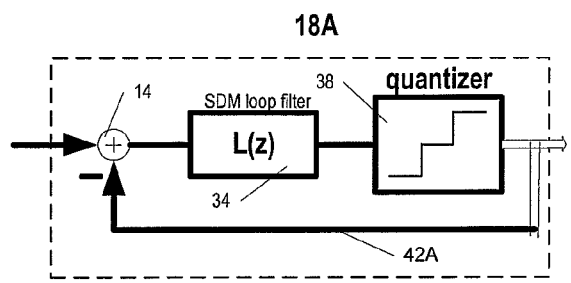
Figure 3:
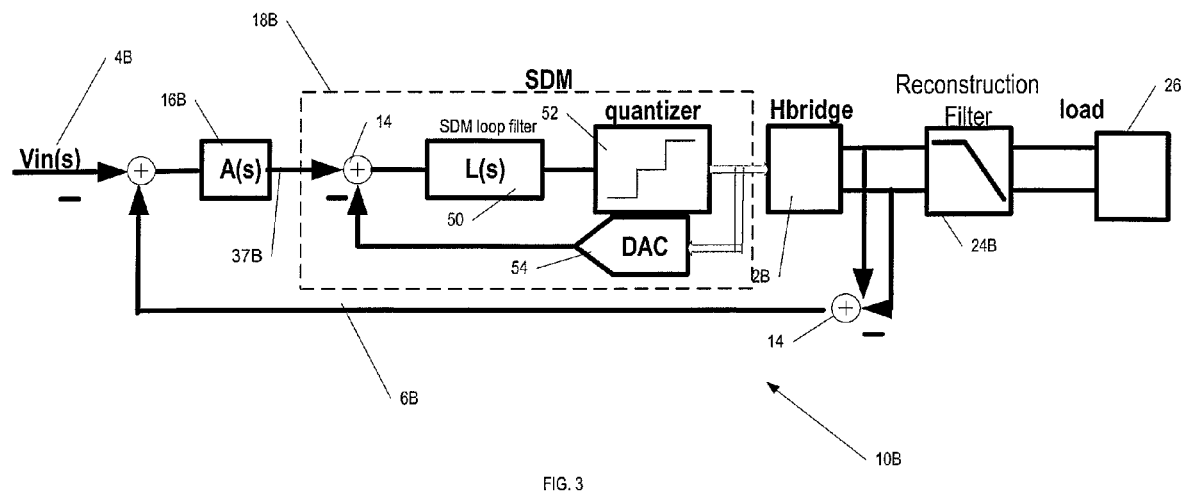
FIG. 3 is a block diagram of an amplifier circuit in accordance with a third embodiment of the invention.

FIG. 1 is a block diagram of an amplifier circuit 10 in accordance with a first embodiment of the invention, FIG. 2A is a block diagram of an amplifier circuit 10A in accordance with a second embodiment of the invention, and FIG. 3 is a block diagram of an amplifier circuit 10B in accordance with a third embodiment of the invention. FIG. 1 is applicable to various applications of the invention, including applications for use in receiving a digital or analog input signal 4, amplifying it, and providing it as a signal to a load 26 (which, for example, could be a loudspeaker or a servo motor). FIG. 2A represents one a particular implementation of the amplifier 10 of FIG. 1, where FIG. 2A is adapted for use with a digital input signals 4A and an analog load 26. FIG. 3 represents another particular implementation of the amplifier 10 of FIG. 1, where FIG. 3 is adapted for use with an analog input signal 4B and an analog load 26.

Those of skill in the art will recognize that the circuit of FIG. 1 has numerous applications and is not limited to the particular applications described in connection with FIGS. 2A and 3. For example, the circuit of FIG. 1 can be adapted for use as part of a voltage regulator, audio amplifier, servo amplifier, servo control, digital control, switching power amplifier, and/or a switching power supply, as well as many other uses that will be apparent to those of skill in the art.

Referring to FIG. 1, the amplifier 10 includes a junction 14, a loop filter 16, a sigma delta modulator (SDM) 18, a pulse processor 20, an output stage 22, an optional output filter 24 and a feedback control loop 6, all interconnected substantially as shown. The input signal 4 can comprise an audio, power, or control waveform. For example, the input signal 4 can be a digital signal (as in digital input signal 4A of FIG. 2) or an analog signal (as in analog input signal 4B of FIG. 3). In a further embodiment, the input signal 4 can be a mixed signal (i.e., a signal having both analog and digital components), where the digital portion of input signal 4 is presented to junction 37 (e.g., a summer) and the analog portion is presented to junction 14 (e.g., a summer). In addition, with a mixed signal, an analog gain (volume) control can be applied to the reference voltage of the ADC 30 or a digital multiplier can be used for gain control at either the output signal 6A or input signal 4A The junction 14 (which in at least one embodiment can be implemented as a summer or summing junction) is capable of combining a feedback signal 6 with an input signal 4 (e.g., subtracting a feedback signal 6 from input signal 4) to provides an error signal 37, where error signal 37 is based on the difference between the feedback signal 6 (which in this example is based on the sampled output at the output stage 22) and the input signal 4. The junction 14 is implemented in one embodiment using a difference amplifier, but those of skill in the art will recognize that the junction 14 can be implemented using many different circuits, such as adder circuits, accumulator circuits, summer circuits (also referred to as a summing junctions), etcetera.

The loop filter 16 further filters the error signal 37 from junction 14 and the input signal 4 so as to not affect the noise-shaping characteristics of the SDM 18. The loop filter 16 removes the high frequency noise and harmonics of the error signal 37 created by the sampling of the quantizer inside the SDM 18 and by the pulse process 20. In one embodiment, the loop filter 16 can be implemented using an integrator, such as a discrete time integrator or a continuous time integrator. As those of skill in the art will appreciate, by using a loop filter of higher order, a better SNR can be achieved, but care should be taken to avoid potential stability problems. As those of skill in the art will further appreciate, the integrator 16 also can be implemented using a discrete time integrator or a continuous time integrator.

The SDM 18 is implemented using a digital SDM or an analog SDM, depending on the input signal 4 (i.e., the SDM is a digital SDM if the input signal 4 is a digital signal and is an analog signal if the input signal 4 is an analog signal). For example, the amplifier circuit 10A of FIG. 2A uses a digital SDM 18A with its digital input signal 4A and the amplifier circuit 10B of FIG. 2B uses an analog SDM 18B with its analog input signal 4B. The SDM 18 oversamples the input signal 4 and error signal 37 to produce a plurality of noise-shaped output pulses based on the error signal 37 from junction 14 and based at least in part on the input signal 4. In one advantageous embodiment, the digital output value from the SDM 18 input value is encoded over 1.5 bits. The SDM 18 of FIG. 1 (as well as the SDMs 18A and 18B of FIGS. 2A and 3, respectively) can be implemented by any known sigma delta modulation techniques.

Advantageously, in one embodiment, the SDM 18 includes its own localized sigma delta modulator (SDM) feedback loop (that is, an SDM feedback loop within the SDM 18 itself) to provides modulation control for the output stage, and this localized feedback loop is in addition to the second feedback loop 6 that uses feedback from the input to the load 26. For example, FIG. 2B is a block diagram of the digital SDM 18A, showing that the digital SDM 18A includes a feedback loop 42A coupling the output of SDM quantizer 38 to the SDM loop filter 34. FIG. 3 likewise illustrates the details of analog SDM 18B. Note that for the SDM 18B of FIG. 3, the feedback loop 42B further includes a digital to analog converter (DAC) 54, as the output of the quantizer is a digital signal and the input signal 4B is an analog signal.

Referring again to FIGS. 1, 2A, and 3, pulse processing circuit 20 processes the noise shaped output pulses from the SDM 18 to ensure that each of the noise shaped output pulses contains substantially the same energy as each other noise shaped output pulse. For example, in one embodiment, the pulse processing circuit processes at least a portion of the plurality of noise-shaped output pulses to ensure that each of the noise-shaped output pulses in the portion contains an amount of energy that is as close as possible to the amount of energy in the other pulses. Advantageously, each pulse will have the same energy as the other pulses, but the invention will work with processing that can help to equalize the energy in the pulses so that the pulses each contain about the same energy.

The energy provided to the load 26 is equivalent to the total area under the pulses. The area under a given pulse is affected by the rise and fall times on the edge of each pulse. If each noise shaped output pulse is not substantially the same as the other noise shaped output pulses, the signal to noise ratio of the amplifier can be negatively impacted. For example, if a given rising or falling edge is "lost" (such as if a pulse does not go all the way up to logic one or down to logic zero before transitioning to the next pulse) or if the edges have different delays, (as might occur with situation such as clock jitter), the area of the integrated pulse would be substantially different. This can cause an error in the value of data associated with the pulse.

To overcome this issue, it is desirable to keep the area of each pulse (e.g., time-voltage area) as unvarying as possible. The pulse processing circuit 20, in one embodiment, processes the noise-shaped output pulses from the SDM 18 so as to equalize switching transitions that occur in the SDM 18. In one embodiment, the pulse processing circuit 20 uses a zero returning circuit, which can comprise, for example, a return-to-zero (RTZ) circuit to help ensure that each of the noise shaped pulses contains the same energy as the other noise shaped pulses, by verifying that each output sample contains equal number of rising edge and falling pulse edges (typically either none or exactly one of each). In a further embodiment, the zero returning circuit used by the pulse processing circuit 20 comprises a Half Return to Zero (HRZ) circuit (which can operate as a "delayed" version of an RTZ circuit).

Referring again to FIGS. 1, 2A, and 3, the output stage 22 receives the processed noise shaped output pulses from the pulse processing circuit 20 and uses them as a driving signal to drive voltage (or current) to the load 26. The output stage 22 can be implemented using many different types of circuits, including but not limited to an H-bridge, an output driver, a switching output stage, a boost output stage, a buck-boost output stage, a Class-D switching stage, and a tri-state buffer.

An additional benefit of at least some embodiments of the invention is that driving transistors in the output stage 22 can have reduced performance requirements, which potentially permits high efficiency, low distortion audio amplifiers to be realized in standard CMOS system-on-chip integrated circuits.

The output stage 22 has a first state in which the output stage 22 provides analog noise-shaped output pulses to the load 26 and a second state in which the output stage 22 essentially delivers zero output energy to the load 26 (almost as if the output stage 22 is not connected to the load 26). For example, in the amplifier 10A of FIG. 2A, in which the loop filter 16A, SDM 18A, and RTZ 20A are synchronized with a clock signal 32, the output stage 22 can be configured and selected so that the output stage 22 delivers no output energy to the load 26 during a return to zero portion of the clock signal 32. It is during this time that the outputs of the output stage 22 are sampled and fed back, as explained further below. Note that referenced "zero output energy" or "no output energy" does not necessarily require that absolutely no energy whatsoever be permitted to go to the load; it is permissible to have inconsequential amounts of output energy being provided to the load 26.

Note that the clock signal 32 of FIG. 2A, in one embodiment, can range from 500 kHz to about 500 MHz. Advantageously, the clock signal 32 will have a frequency of 30 to 100 times the bandwidth of the input signal.

In another example using the embodiment of FIG. 2A, the outputs of the RTZ 20A are fed into the H-bridge 22A, which serves as a switching output stage for the amplifier 10A (which in this embodiment is a class-D amplifier). The outputs 36A, 36B of the H-bridge 22A are connected to an output filter 24 (which by way of illustration is illustrated as a low-pass filter in FIG. 2A) to suppress the high frequency noise and to convert the processed noise-shaped output pulses into one or more amplified output pulses that drive the load 26 (where the load 26 in FIG. 1 is shown for illustrative purposes as a speaker).

Advantageously, for maximum power efficiency, the output impedance of the output stage 22 (e.g., H-bridge 22A) preferably is as small as possible. Theoretically, for maximum power efficiency in the Class-D amplifier 10A, the output impedance of the H-bridge 22A is zero ohms. In a practical "real-world" circuit, however, the output impedance of the H-bridge 22A is a few fractions of an ohm. The requirement of an H-bridge 22A with very low output impedance can be challenging, because, the size of the transistors used in the H-bridge 22 are relatively large compared to the other components in the amplifier circuit 10.

To help reduce the effective output impedance of the output stage 22, FIGS. 1, 2A, and 3 all incorporate a second SDM feedback control loop 6, 6A, 6B which utilizes feedback from the output of the output stage 22. The feedback from this feedback loop 6 (which effectively acts as a "second" SDM loop) greatly improves the linearity and amplitude fidelity of the signal to the load 26 in the presence of factors including but not limited to power supply variation, output driver transistor mismatch, rise/fall time asymmetry, clock jitter, and circuit mismatch due to process variation. Having a low AC output impedance in an amplifier is advantageous because the low AC output impedance helps to increase the damping factor for certain types of amplifier loads, such as speakers, which can help the speakers to follow the original (amplifier input) signal more precisely.

Still another advantage is that the feedback loop 6 can, in some embodiments, help to noise-shape switching noise at the actual load 26 of the amplifier 10, whereas prior art SDM switching controllers only shape quantization noise at the input of the driver stage. To reduce the effective output impedance of the output stage 22, the input voltage (or current) to load, from the output stage 22 is sensed (e.g., at 36a and 36b of FIG. 1) prior to being filtered, and is sensed during a state when the output stage 22 is delivering essentially zero output energy to the load 26. For example, in the amplifier 10A of FIG. 2A, the sensing of the output signals 36A and 36B is performed during a portion of the clock signal when the H-bridge 22A is delivering essentially zero output energy to the load. This action is possible because the output of the H-bridge 22A is in a high-impedance state during a predetermined portion of the clock signal 32 due to the operation of the RTZ 20A.

Although it is possible to implement a feedback loop 6 by sampling the signals from the output filter 24, this approach can present some difficulties. Some types of output filters 24, such as low-pass filters that include an inductor and a capacitor, can introduce a pole (and, hence, a phase shift). If the amplifier 10 does not properly compensate for this pole, the amplifier may become unstable and oscillate. Another alternative is to implement a feedback loop from both the output stage 22 and the output of filter 24. This way of providing feedback can still present stability problems because of the output filter 24 phase shift.

The feedback loop 6 is coupled between the output stage 22 and the junction 14 that feeds the loop filter 16 and the SDM 18. The feedback loop 6 samples at least a portion of the noise-shaped output pulses provided by the output stage 22, and the sampling advantageously occurs when the output stage 22 is delivering essentially zero output energy to load 26. The feedback signal 26 is subtracted from the input signal 4 to generate an error signal 37.

As shown in FIG. 2A, the pair of outputs of the H-bridge 22, 36a and 36b, are effectively combined at junction 14 to become feedback signal 36. Feedback signal 36 is converted to a digital signal by analog to digital converter (ADC) 30. In one embodiment, the ADC 30 is a three-level flash ADC, which helps to simplify the design of the amplifier 10. The feedback signal 36 outputted from ADC 30 is then fed back to the junction 14, which creates error signal 37 as described previously. The error signal 27 is filtered by loop filter 16 so as not to affect the noise-shaping characteristic of the SDM 18. In this way, the effective output impedance of the H-bridge 22 is made smaller by a predetermined factor, where the predetermined factor is equal to the gain of the feed-forward loop filter of the SDM.

Using the amplifier circuit 10 of FIG. 1, the inventors have found improved accuracy and efficiency as compared to prior art amplifier circuits. For example, in one embodiment, an improvement in signal-to-noise ration (SNR) at the input to the load 26 from 30 dB to about 70 dB was achieved.

Figure 4:
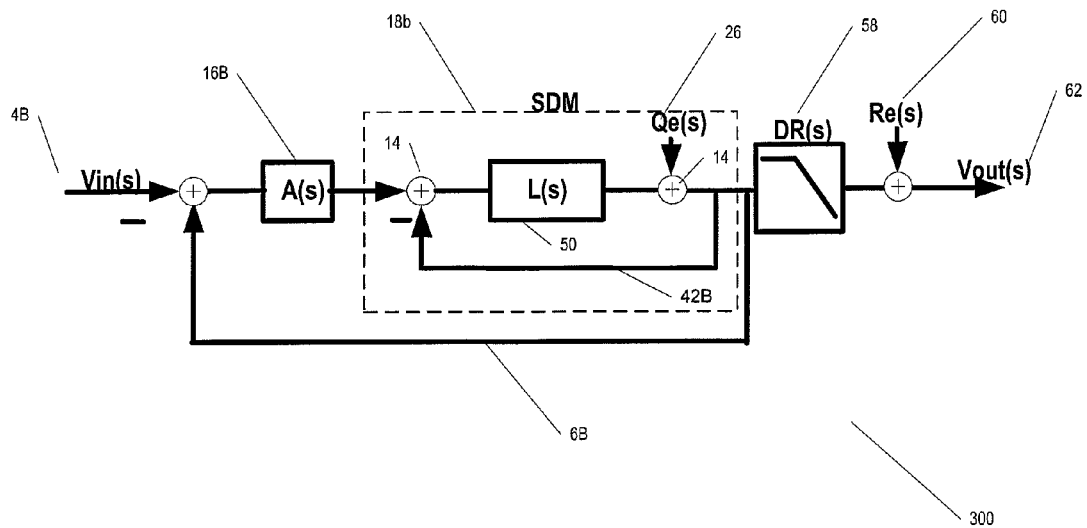
FIG. 4 is a linearized system model of the amplifier circuit of FIG. 3.

FIG. 4 illustrates a linearized model if the amplifier 10B of FIG. 3. A mathematical description of FIG. 3 is complex due to the nonlinear nature of the devices, but FIG. 4 provides a linearized model of the system that demonstrates the principle of operation and can be analyzed to provide an intuitive understanding of the benefits of this embodiment of the invention. Referring to FIGS. 3 and 4, the quantizer 52 in the local SDM 18 loop is modeled as an ideal quantizer plus an added error term Qe(s) 26. Similarly, the output driver/reconstruction filter stage 22B and 24B is modeled as an ideal voltage output 58 plus an added error term Re(s) 60. This error term 60 will include switching noise from the class D driver 22B that is not rejected by the reconstruction filter 24B and noise due to circuit non-idealities such as clock jitter and asymmetric rise and fall times at the power driver.

The transfer function for the system shown in FIG. 4 can be shown to be:

$$Vout(s) = Vin(s)\frac{A(s)M(s)DR(s)}{1+A(s)M(s)DR(s)} + Qe(s)\frac{DR(s)}{1+L(s)+A(s)DR(s)L(s)} + Re(s)\frac{1}{1+L(s)+A(s)M(s)DR(s)}$$ Eq. 1 where M(s) is the transfer function of the local sigma delta modulator loop:

$$SDMout(s) = SDMin(s)\frac{L(s)}{1+L(s)} + Qe(s)\frac{1}{1+L(s)}$$ Eq. 2

Equation 2 illustrates the well-known noise shaping properties of conventional sigma delta modulators. The feedback loop causes the quantizer noise Qe(s) to be "shaped", i.e. pushed out to a relatively high frequency, by the high pass filter effect of the quantization error multiplier term $1/(1+L(s))$, where L(s) is an integrator. This can be readily seen by examining equation 2 in the limit as the frequency goes to zero: if e.g. $L(s)=1/s$, then L(s) will be large, so the quantization error term $1/(1+L(s))$ will approach zero and the desired signal term $L(s)/(1+L(s))$ will approach unity.

Equation 1 reveals that with proper choice of parameters in the topology shown in FIG. 3, not only can the quantizer noise Qe(s) 26 be shaped, but the undesired noise error term at the load Re(s) 60 can also be shaped, while the desired signal will be delivered to the load 26. This can be understood by considering the values of the various terms in the in the limit of low frequency:

$A(s)_{s \to 0} \approx \infty$ if A(s) is an integrator $L(s)_{s \to 0} \approx \infty$ if L(s) is an integrator $DR(s)_{s \to 0} \approx 1$ if DR(s) is a low pass reconstruction filter followed by a typical load $M(s)_{s \to 0} \approx 1$ if M(s) is a local sigma delta modulator that recovers the input signal while filtering out quantizer noise For the first term of equation 1, i.e. the desired signal:

$$\frac{A(s)M(s)DR(s)}{1+A(s)M(s)DR(s)_{s \to 0}} \approx 1$$

therefore the desired signal at the frequency of interest is delivered at the load For the second term of equation 1 i.e. the quantization error term:

$$\frac{DR(s)}{1+L(s)+A(s)L(s)DR(s)_{s \to 0}} \approx 0$$

therefore low frequency quantization noise at the input of the H-bridge is rejected For the third term of equation 1 i.e. the load ripple noise error term:

$$\frac{1}{1+A(s)M(s)DR(s)_{s\to 0}} \approx 0$$

therefore undesired low frequency noise at the load is rejected
The aggregate response of the system described by equation 2 at frequencies of interest therefore consists of the desired signal delivered at the load, with SDM quantizer noise and driver noise rejected.

A further benefit of the embodiments of the invention as described in FIGS. 1-3 is that the AC output impedance of the load driver is reduced by feedback taken from the load. The output impedance of an arbitrary feedback system is given by: Ro_f=$R_o$/(1+$G_{loop}$), where Ro_f is the output impedance including feedback, $R_o$ is the output impedance of the driver output without feedback, and $G_{loop}$ is the loop gain of the system.

In at least some embodiments, the invention as described in FIGS. 1-3 can also be applied to servo power drivers, which are typically operated in transconductance mode. In this case the feedback signal would be derived from a load current sensor. The voltage measured at the system output could be heavily affected by the output buffer. A more accurate output voltage feedback signal could potentially be sampled during the intervals when the output stage 22 is delivering essentially zero energy to the load.

Figure 5:
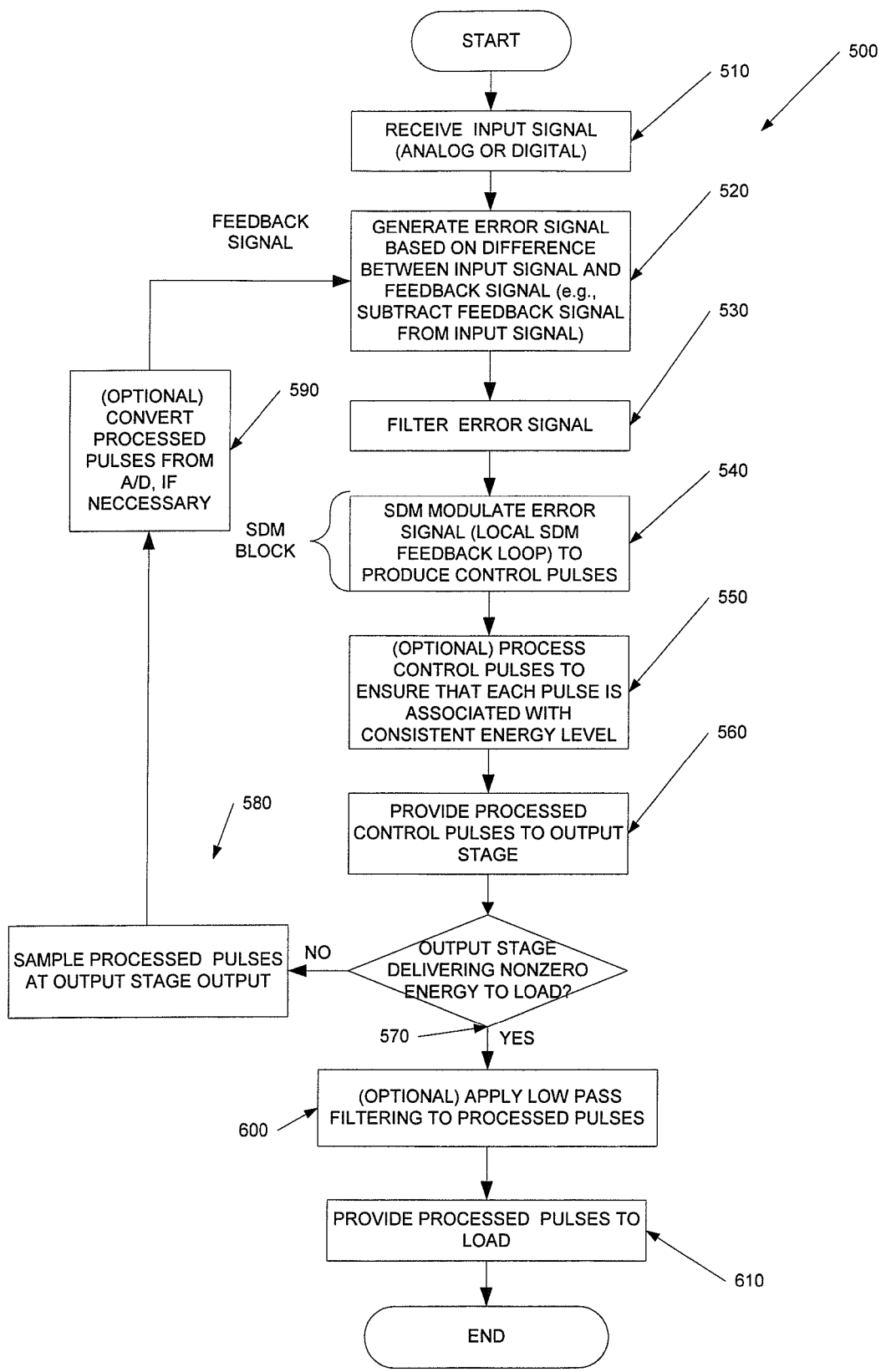
FIG. 5 is a flow chart of a method in accordance with one embodiment of the invention.

FIG. 5 is a flow chart of a method 500 in accordance with one embodiment of the invention. Referring to FIGS. 1 and 5, an input signal to the amplifier 10 is received (block 510), where the input signal can be analog, digital, or both. If a feedback signal is present, an error signal is generated based on the difference between the input signal and the feedback signal (block 520). For example, the feedback signal can be subtracted from the input signal to generate an error signal. If the feedback signal is very close to the input signal, the resultant error signal will be very small. In one embodiment, the error signal is processed using techniques well known for control system theory. Appropriate processing techniques include, for example, simple integration, filtering, or more advanced techniques such as Proportional Integrating (PI), or Proportional Integrating Differential (PID) controllers. The processed error signal is noise shaped by the SDM and is used to generate the drive signal to the load.

The noise shaped control pulses from the SDM are processed (block 550) to ensure that each pulse is associated with a consistent or similar energy level, such as by processing the pulses with an RTZ circuit. The processed noise shaped control pulses are then provided to the output stage (block 560). If the output stage is delivering energy to the load (block 570), the processed noise shaped control pulses are used to drive the load. For example, in one embodiment, the processed noise shaped pulses are provided to the load during a first portion of time (e.g., a first portion of the clock cycle), and are disconnected from the load during a second portion of time (e.g., a second portion of the clock cycle, such as during the rising or falling edge of a clock cycle). The output stage can convert the processed noise shaped pulses to amplified output pulses capable of driving the load. Optionally, the processed noise shaped control pulses can be filtered (block 600) to suppress noise such as high frequency noise.

If the output stage is not delivering energy to the load (block 570), then the processed noise-shaped pulses are sampled at the output of the output stage (block 580). If necessary, the sampled pulses are converted to a format usable in a comparison with the input signal (block 590). For example, in the digital amplifier 10A of FIG. 2A, the processed noise shaped pulses provided by the output stage 22 are, effectively, analog pulses (to drive the analog load 26); thus, the processed noise shaped pulses must be converted from analog to digital (block 590), so that they can be subtracted from the digital input signal 4A (block 520).

It should also be appreciated that the flow chart 500 of FIG. 5 does not depict the syntax of any particular programming language. Rather, the flow chart 500 of FIG. 5 illustrates the functional information one of ordinary skill in the art requires to fabricate circuits or to generate computer software to perform the processing required of the particular apparatus (e.g., amplifier). It should be noted that many routine program elements, such as initialization of loops and variables and the use of temporary variables are not shown. It will be appreciated by those of ordinary skill in the art that unless otherwise indicated herein, the particular sequence of steps described is illustrative only and can be varied without departing from the spirit and scope of the invention.

One or more embodiments of the invention may also be realized wholly or partially in software, in a computer-readable medium, and/or in a transmission medium. For example, software embodying the present invention, in one embodiment, resides in an application running on a general-purpose computer system. In at least one embodiment, the present invention is embodied in a computer-readable program medium usable with the general purpose computer system, such as a compact disk, USB drive, optical drive, or other computer-readable media. In addition, in one embodiment, the invention is embodied in a transmission medium, such as one or more carrier wave signals transmitted between the general purpose computer system and another entity, such as another computer system, a server, a wireless network, etc.

Throughout this document, unless the context provides a clear contrary indication, it is intended that individual circuit elements as described may be singular or plural in number. For example, the terms "circuit" and "circuitry" may include either a single component or a plurality of components, which are either active and/or passive and are connected or otherwise coupled together to provide the described function. Further, the terms "pulse" and "signal" may refer to one or more currents, one or more voltages, or a data signal. Also, although the embodiments of the invention have been discussed in the context of implementations using discrete electronic circuitry (preferably in the form of one or more integrated circuit chips), the functions of any part of such circuitry may alternatively be implemented using one or more appropriately programmed processors, depending upon the signal frequencies or data rates to be processed. Moreover, the embodiments described herein may be used to implement all or a portion of a signal path or loop path in another device or system.

In describing the embodiments of the invention illustrated in the figures, specific terminology (e.g., language, phrases, terms, etc.) is used for the sake of clarity. These names are provided by way of example only and are not limiting. The invention is not limited to the specific terminology so selected, and each specific term at least includes all grammatical, literal, scientific, technical, and functional equivalents, as well as anything else that operates in a similar manner to accomplish a similar purpose.

Although the invention has been described and pictured in a preferred form with a certain degree of particularity, it is understood that the present disclosure of the preferred form, has been made only by way of example, and that numerous changes in the details of construction and combination and arrangement of parts may be made without departing from the spirit and scope of the invention. Having described and illustrated the principles of the technology with reference to specific implementations, it will be recognized that the technology can be implemented in many other, different, forms, and in many different environments. The technology disclosed herein can be used in combination with other technologies, and the embodiments of the invention described herein can be modified to accommodate and/or comply with changes and improvements in the applicable technology and standards referred to herein.

Having described the preferred embodiments of the invention, it will now become apparent to one of ordinary skill in the art that other embodiments incorporating their concepts may be used. These embodiments should not be limited to the disclosed embodiments, but rather should be limited only by the spirit and scope of the appended claims.

The invention claimed is:

1. An amplifier capable of driving an analog load, the amplifier comprising:
   a sigma delta modulator (SDM) producing a plurality of noise-shaped output pulses based upon a digital input signal to the amplifier and an error signal;
   a pulse processing circuit, the pulse processing circuit processing at least a portion of the plurality of noise-shaped output pulses to ensure that each of the noise-shaped output pulses in the portion contains an amount of energy that is as close as possible to the amount of energy in the other noise-shaped output pulses;
   an output stage coupled to the pulse processing circuit, the output stage having a first state wherein the output stage provides analog noise-shaped output energy pulses to a load and a second state where an output energy delivered is essentially zero; and
   a feedback loop coupled between an output of the output stage and an input of the SDM, the feedback loop sampling the analog noise-shaped output energy pulses provided to the load during the first state by measuring the load during the second state, and generating an error signal based on the difference between the sampled analog noise-shaped output energy pulses and the input digital signal to the amplifier.

2. The amplifier of claim 1, wherein the feedback loop converts the noise-shaped output pulses to digital pulses and provided the error signal as a digital signal.

3. The amplifier of claim 2, wherein the feedback loop further comprises an analog-to-digital (A/D) converter, the A/D converter converting a plurality of analog noise-shaped output energy pulses from the output stage to a corresponding plurality of digital pulses.

4. The amplifier of claim 3, wherein the A/D converter comprises a three-level A/D converter.

5. The amplifier of claim 3, wherein the A/D converter comprises a flash A/D converter.

6. The amplifier of claim 1, wherein the output stage comprises at least one element selected from the group consisting of an H-bridge, an output driver, a switching output stage, boost output stage, buck-boost output stage, a Class-D switching stage, and a tri-state buffer.

7. The amplifier of claim 1, further comprising a filter coupled between the output stage and the load, the filter constructed and arranged to suppress at least a portion of the noise associated with the noise shaped output energy pulses.

8. The amplifier of claim 1, wherein the amplifier further comprises a difference amplifier coupled between the feedback loop and the SDM, the difference amplifier subtracting the error signal from the input signal to the amplifier.

9. The amplifier of claim 8, wherein the amplifier further comprises a loop filter coupled between the difference amplifier and the SDM, the loop filter receiving the combined input and feedback signals and providing a filtered input signal to the SDM.

10. The amplifier of claim 9, wherein the loop filter comprises an integrator.

11. The amplifier of claim 1, wherein the pulse processing circuit comprises a circuit capable of equalizing switching transitions that occur in the SDM.

12. The amplifier of claim 1, wherein the pulse processing circuit comprises a half return to zero (HRZ) circuit.

13. The amplifier of claim 1, wherein the pulse processing circuit comprises a return-to-zero (RTZ) circuit.

14. The amplifier of claim 1, wherein the pulse processing circuit ensures that each noise-shaped output energy pulse contains the same number of rising and falling edges.

15. The amplifier of claim 14, wherein the SDM and pulse processing circuit are coupled to a clock signal and wherein the output stage is configured to be in the second state during a return-to-zero portion of the clock signal.

16. The amplifier of claim 10, wherein the feedback loop samples the analog noise shaped output energy pulses during a portion of the clock signal when the output stage is disconnected from the load.

17. The amplifier of claim 1, wherein the amplifier is constructed and arranged to operate as at least one circuit selected from the group consisting of a class D amplifier, voltage regulator, audio amplifier, servo amplifier, servo control, digital control, switching power supply, and switching power amplifier.

18. A method of driving an analog load with a digital signal, the method comprising:
   receiving a digital input signal;
   converting the digital input signal to a plurality of noise shaped output pulses;
   processing at least a portion of the plurality of noise-shaped output pulses to ensure that each of the noise shaped output pulses in the portion contains an amount of energy that is as close as possible to the amount of energy in the other noise-shaped output pulses;
   obtaining a sample of energy delivered by at least a portion of the processed noise-shaped output pulses;
   generating an error signal based on the difference between the sampled processed noise-shaped output pulses; and
   using the error signal during the conversion of the digital input signal to a plurality of noise-shaped output pulses.

19. The method of claim 18, further comprising ensuring that each noise-shaped output pulse contains the same number of rising and falling edges.

20. The method of claim 18 further comprising switchably providing the processed noise-shaped output pulses to a load, wherein during at least a first portion of time the processed noise-shaped output pulses are provided to a load and during at least a second portion of time the load receives essentially zero output energy.

21. The method of claim 20 wherein the sample is obtained during the second portion of time.

22. The method of claim 18, wherein the conversion of the digital input signal and the processing of the noise-shaped output pulses are synchronized with a clock signal and wherein the sample is obtained during a return-to-zero (RTZ) portion of the clock signal.

23. The method of claim 18, further comprising providing the processed portion of the plurality of noise-shaped output pulses to a load.

24. A system for driving an analog load with a digital signal, the system comprising:
- means for receiving a digital input signal;
- means for converting the digital input signal to a plurality of noise shaped output pulses;
- means for processing at least a portion of the plurality of noise-shaped output pulses to ensure that each of the noise shaped output pulses in the portion contains an amount of energy that is as close as possible to the amount of energy in the other noise-shaped output pulses;
- means for obtaining a sample of at least a portion of the processed noise-shaped output pulses;
- means for generating an error signal based on the difference between the sampled processed noise-shaped output pulses; and
- means for using the error signal during the conversion of the digital input signal to a plurality of noise-shaped output pulses.

25. The system of claim 24, further comprising means for suppressing at least a portion of noise associated with the noise shaped output pulses before the noise-shaped output pulses are provided to a load.

26. The system of claim 24, further comprising means for ensuring that each noise-shaped output pulse contains the same number of rising edges as falling edges.

27. An article of manufacture, comprising:
- a computer useable medium and computer readable code embodied on the computer useable medium for driving an analog load with a digital signal, the computer readable code comprising:
  - computer readable program code devices configured to receive a digital input signal;
  - computer readable program code devices configured to convert the digital input signal to a plurality of noise shaped output pulses;
  - computer readable program code devices configured to process at least a portion of the plurality of noise-shaped output pulses to ensure that each of the noise shaped output pulses in the portion contains an amount of energy that is as close as possible to the amount of energy in the other noise-shaped output pulses;
  - computer readable program code devices configured to obtain a sample of at least a portion of the processed noise-shaped output pulses;
  - computer readable program code devices configured to generate an error signal based on the difference between the sampled processed noise-shaped output pulses; and
  - computer readable program code devices configured to use the error signal during the conversion of the digital input signal to a plurality of noise-shaped output pulses.

28. The article of manufacture of claim 27, further comprising computer readable program code devices configured to ensure that each noise-shaped output pulse contains the same number of rising edges as falling edges.

29. The article of manufacture of claim 27, further comprising computer readable program code devices configured to switchably provide the processed noise-shaped output pulses to a load, wherein during at least a first portion of time the processed noise-shaped output pulses are provided to a load and during at least a second portion of time the load receives essentially zero output energy.

30. The article of manufacture of claim 29, further comprising computer readable program code devices configured to obtain the sample during the second portion of time.

31. The article of manufacture of claim 27, further comprising computer readable program code devices configured to synchronize the conversion of the digital input signal and the processing of the noise-shaped output pulses with a clock signal and computer readable program code devices configured to obtain the sample during a return-to-zero (RTZ) portion of the clock signal.

32. A signal path, comprising:
- a sigma delta modulator (SDM) receiving a digital input signal and producing a plurality of noise-shaped output pulses based upon the digital input and an error signal;
- a pulse processing circuit, the pulse processing circuit processing at least a portion of the plurality of noise-shaped output pulses to ensure that each of the noise-shaped output pulses in the portion contains an amount of energy that is as close as possible to the amount of energy in the other noise-shaped output pulses;
- an output stage coupled to the pulse processing circuit, the output stage having a first state wherein the output stage is capable of providing analog noise-shaped output pulses to a load and a second state where the output stage is delivers essentially zero output energy to the load; and
- a feedback loop coupled between an output of the output stage and an input of the SDM, the feedback loop sampling at least a portion the analog noise-shaped output pulses provided by the output stage when the output stage is in the second state, and generating an error signal based on the difference between the sampled portion of the analog noise-shaped output pulses and the input digital signal to the amplifier.

33. The signal path of claim 32, wherein the output stage comprises at least one element selected from the group consisting of an H-bridge, an output driver, a switching output stage, a Class-D switching stage, and a tri-state buffer.

34. The signal path of claim 32, wherein the pulse processing circuit ensures that each noise-shaped output pulse contains the same number of rising edges as falling edges.

35. The signal path of claim 32, wherein the pulse processing circuit comprises a zero returning circuit, the zero returning circuit comprising at least one of a circuit selected from the group consisting of a half return-to-zero (HRZ) circuit and a return-to-zero (RTZ) circuit.

36. The signal path of claim 35, wherein the SDM and the zero returning circuit are coupled to a clock signal and wherein the feedback loop samples the portion of the noise shaped output pulses during a portion of the clock signal when the output stage is disconnected from the load.

37. The signal path of claim 32, wherein the feedback loop further comprises an analog-to-digital (A/D) converter, the A/D converter converting the [a] plurality of analog noise-shaped output pulses from the output stage to a corresponding plurality of digital pulses.

38. The signal path of claim 32, wherein the signal path is part of at least one circuit selected from the group consisting of a class D amplifier, voltage regulator, audio amplifier, servo amplifier, servo control, digital control, switching power supply, and switching power amplifier.

* * * * *

UNITED STATES PATENT AND TRADEMARK OFFICE
CERTIFICATE OF CORRECTION

| | | |
|---|---|---|
| PATENT NO. | : 7,605,653 B2 | Page 1 of 4 |
| APPLICATION NO. | : 11/839598 | |
| DATED | : October 20, 2009 | |
| INVENTOR(S) | : Mucahit Kozak et al. | |

It is certified that error appears in the above-identified patent and that said Letters Patent is hereby corrected as shown below:

On the title page item (57), Abstract, line 2, delete "sigma delta" and replace with --sigma-delta--.

In the Drawings,

Sheet 3, FIG. 3, the reference numeral 2B should be changed to 22B.

In the Specification,

Col. 1, line 21, delete "sigma delta" and replace with --sigma-delta--.

Col. 1, line 22, delete "Class D" and replace with --Class-D--.

Col. 1, line 33, delete "class D)." and replace with --Class-D).--.

Col. 1, line 42, delete "sigma delta" and replace with --sigma-delta--.

Col. 1, line 65, delete ", instead using" and replace with --, instead of using--.

Col. 2, line 1, delete "sigma delta" and replace with --sigma-delta--.

Col. 2, line 2, delete "h-bridge." and replace with --H-bridge.--.

Col. 2, line 2-3, delete "sigma delta" and replace with --sigma-delta--.

Col. 2, line 36, delete "analog to digital" and replace with --analog-to-digital--.

Col. 2, line 42, delete "class D" and replace with --Class-D--.

Col. 2, line 45, delete "sigma delta" and replace with --sigma-delta--.

Col. 3, line 10, delete "half return to zero" and replace with --half return-to-zero--.

Col. 3, line 10, delete "return to zero" and replace with --return-to-zero--.

Col. 3, line 11, delete "can ensure that ensures that" and replace with --can ensure that--.

Col. 3, line 17-18, delete "noise shaped" and replace with --noise-shaped--.

Col. 3, line 22, delete "noise shaped" and replace with --noise-shaped--.

Col. 3, line 24, delete "noise shaped" and replace with --noise-shaped--.

Signed and Sealed this
Tenth Day of February, 2015

Michelle K. Lee
*Deputy Director of the United States Patent and Trademark Office*

CERTIFICATE OF CORRECTION (continued)
U.S. Pat. No. 7,605,653 B2

Col. 3, line 46-47, delete "for driving for driving" and replace with --for driving--.

Col. 3, line 50, delete "noise shaped" and replace with --noise-shaped--.

Col. 3, line 52, delete "noise shaped" and replace with --noise-shaped--.

Col. 3, line 61, delete "noise shaped" and replace with --noise-shaped--.

Col. 4, line 6, delete "noise shaped" and replace with --noise-shaped--.

Col. 4, line 9, delete "noise shaped" and replace with --noise-shaped--.

Col. 4, line 42, delete "noise shaped" and replace with --noise-shaped--.

Col. 4, line 44-45, delete "noise shaped" and replace with --noise-shaped--.

Col. 4, line 56, delete "sigma delta" and replace with --sigma-delta--.

Col. 4, line 58, delete "producing" and replace with --producers--.

Col. 5, line 1, delete "is delivers" and replace with --delivers--.

Col. 5, line 21, delete "sigma delta" and replace with --sigma-delta--.

Col. 5, line 40, delete "sigma delta" and replace with --sigma-delta--.

Col. 5, line 45-46, delete "application," and replace with --applications,--.

Col. 5, line 62, delete "one a" and replace with --one--.

Col. 5, line 64, delete "signals" and replace with --signal--.

Col. 6, line 10, delete "sigma delta" and replace with --sigma-delta--.

Col. 6, line 39, delete "a summing)," and replace with --summing),--.

Col. 7, line 2, delete "sigma delta" and replace with --sigma-delta--.

Col. 7, line 5, delete "sigma delta" and replace with --sigma-delta--.

Col. 7, line 7, delete "provides" and replace with --provide--.

Col. 7, line 15, delete "digital to analog" and replace with --digital-to-analog--.

Col. 7, line 19, delete "noise shaped" and replace with --noise-shaped--.

Col. 7, line 20, delete "noise shaped" and replace with --noise-shaped--.

Col. 7, line 21-22, delete "noise shaped" and replace with --noise-shaped--.

Col. 7, line 35, delete "noise shaped" and replace with --noise-shaped--.

Col. 7, line 36, delete "noise shaped" and replace with --noise-shaped--.

Col. 7, line 41, delete "with situation" and replace with --with a situation--.

Col. 7, line 52-53, delete "noise shaped" and replace with --noise-shaped--.

Col. 7, line 53-54, delete "noise shaped" and replace with --noise-shaped--.

Col. 7, line 55, delete "edge" and replace with --edges--.

Col. 7, line 58, delete "Half Return to Zero" and replace with --half return-to-zero--.

Col. 7, line 61, delete "noise shaped" and replace with --noise-shaped--.

Col. 8, line 16, delete "return to zero" and replace with --return-to-zero--.

Col. 8, line 31, delete "class-D" and replace with --Class-D--.

CERTIFICATE OF CORRECTION (continued)
U.S. Pat. No. 7,605,653 B2

Col. 9, line 34, delete "H-bridge" and replace with --H-bridges--.

Col. 9, line 37, delete "analog to digital" and replace with --analog-to-digital--.

Col. 9, line 51, delete "ration" and replace with --ratio--.

Col. 9, line 53, delete "if" and replace with --of--.

Col. 9, line 62, delete "stage 22B and 24B is" and replace with --stages 22B and 24B are--.

Col. 9, line 64, delete "class D" and replace with --Class-D--.

Col. 10, line 13, delete "sigma delta" and replace with --sigma-delta--.

Col. 10, line 21, delete "noise shaping" and replace with --noise-shaping--.

Col. 10, line 22, delete "sigma delta" and replace with --sigma-delta--.

Col. 10, line 36, delete "in the in the" and replace with --in the--.

Col. 10, line 45, delete "sigma delta" and replace with --sigma-delta--.

Col. 10, line 46, delete "noise" and replace with --noise.--.

Col. 10, line 56, delete "load" and replace with --load.--.

Col. 10, line 67, delete "rejected" and replace with --rejected.--.

Col. 11, line 9, delete "rejected" and replace with --rejected.--.

Col. 11, line 47, delete "noise shaped" and replace with --noise-shaped--.

Col. 11, line 52, delete "noise shaped" and replace with --noise-shaped--.

Col. 11, line 55, delete "noise shaped" and replace with --noise-shaped--.

Col. 11, line 56-57, delete "noise shaped" and replace with --noise-shaped--.

Col. 11, line 62, delete "noise shaped" and replace with --noise-shaped--.

Col. 11, line 63-64, delete "noise shaped" and replace with --noise-shaped--.

Col. 12, line 5, delete "noise shaped" and replace with --noise-shaped--.

Col. 12, line 7, delete "noise shaped" and replace with --noise-shaped--.

Col. 12, line 8, delete "analog to digital" and replace with --analog-to-digital--.

Col. 13, line 7, delete ", different, forms," and replace with --, different forms,--.

In the Claims,

Col. 13, line 23, delete "sigma delta" and replace with --sigma-delta--.

Col. 13, line 65, delete "noise shaped" and replace with --noise-shaped--.

Col. 14, line 14, delete "half return to zero" and replace with --half return-to-zero--.

Col. 14, line 26, delete "noise shaped" and replace with --noise-shaped--.

Col. 14, line 31, delete "class D" and replace with --Class-D--.

Col. 14, line 38-39, delete "noise shaped" and replace with --noise-shaped--.

Col. 14, line 41-42, delete "noise shaped" and replace with --noise-shaped--.

Col. 15, line 8, delete "noise shaped" and replace with --noise-shaped--.

CERTIFICATE OF CORRECTION (continued)
U.S. Pat. No. 7,605,653 B2

Col. 15, line 11, delete "noise shaped" and replace with --noise-shaped--.

Col. 15, line 25, delete "noise shaped" and replace with --noise-shaped--.

Col. 15, line 38-39, delete "noise shaped" and replace with --noise-shaped--.

Col. 15, line 42, delete "noise shaped" and replace with --noise-shaped--.

Col. 16, line 14, "sigma delta" and replace with --sigma-delta--.

Col. 16, line 27, delete "is delivers" and replace with --delivers--.

Col. 16, line 30, delete "portion the" and replace with --portion of the--.

Col. 16, line 50-51, delete "noise shaped" and replace with --noise-shaped--.

Col. 16, line 55, delete "the [a]" and replace with --the--.

Col. 16, line 60, delete "class D" and replace with --Class-D--.